MULTIBAND VARACTOR TV TUNER
Filed April 10, 1968
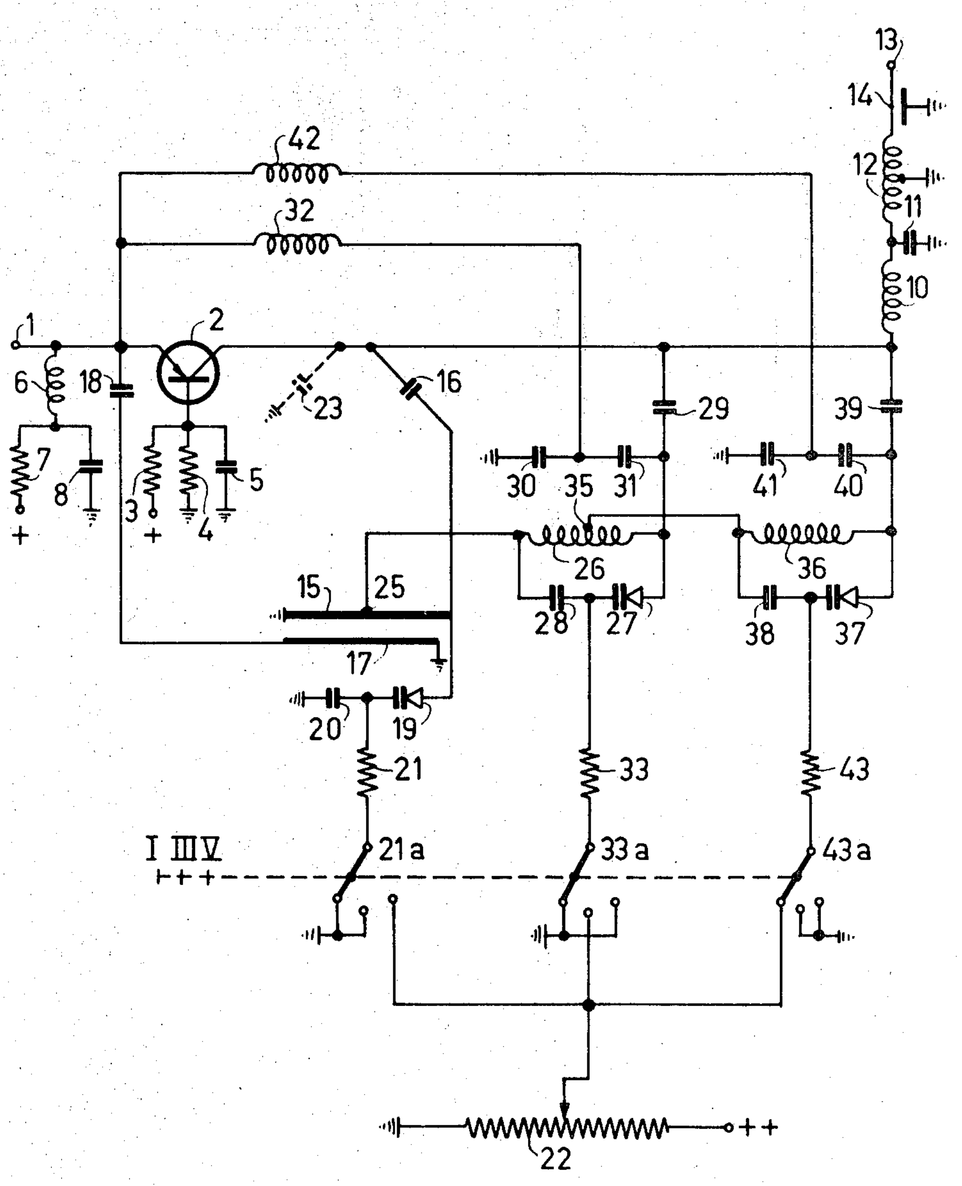
INVENTOR.
WALTER PÜTZER
BY [signature]
AGENT

United States Patent Office 3,564,423
Patented Feb. 16, 1971

3,564,423

MULTIBAND VARACTOR TV TUNER

Walter Pützer, Krefeld, Germany, assignor to U.S. Philips Corporation, New York, N.Y.

Filed Apr. 10, 1968, Ser. No. 720,126
Claims priority, application Germany, Apr. 29, 1967, P 42,041
Int. Cl. H04b *1/16*

U.S. Cl. 325—458 2 Claims

ABSTRACT OF THE DISCLOSURE

A multiple band tuning circuit having resonant circuits for each band that are connected to be tuned by separate voltage dependent reactances. The higher frequency resonant circuits are tapped, and are connected in the circuit to form separate bridge circuits, with the taps being positioned so that each bridge is in balance at the tuning frequencies of the respective band. Each lower frequency resonant circuit is connected to the tap of the next higher frequency resonant circuit.

The invention relates to a circuit arrangement for tuning a receiver in at least two frequency ranges by means of voltage-dependent impedances, particularly capacitance diodes, a resonance circuit having one voltage-dependent impedance being provided for each frequency range and, for reception in a frequency range, the voltage of the voltage-dependent impedance for a different frequency range being adjusted to a value which switches off the circuit arrangement for reception in the last-mentioned frequency range.

In receivers, for example, television receivers, which must be tuned to a number of frequency ranges it has been found to be advantageous to carry out both the tuning and the range changing purely electronically. Due to the electronic tuning, for example, by means of capacitance diodes an economy is obtained by omitting the frequency used but large and expensive mechanical variable capacitors. If in addition the range changing is carried out electronically, for example, by means of switching diodes, the construction of the tuning unit may be simplified considerably.

However, switching diodes involve certain costs and in addition cause stray capacitances so that the tuning may be influenced particularly at the high frequency end of the range.

In the circuit arrangement of the kind described in the preamble at least part of the capacitance diodes required for tuning is therefore also utilized to render the non-required resonance circuits inoperative by distuning and/or damping. By suitable supply of the DC voltages the capacitance diodes are thus not only utilized for tuning but also for range changing.

In the said circuit arrangement the elements of the resonance circuits of the respective frequency ranges are connected together. Although in the reception of one frequency range the resonance circuits for reception in the other frequency range are switched off due to suitable biasing of the capacitance diodes, the said coupled condition results in the fact, that the elements of the resonance circuits which are switched off may materially influence the tuning and the quality of the resonance circuit which is switched on. It has been found more particularly that the reception in a comparatively high frequency range is detrimentally influenced by the elemens of the resonance circuits for the lower frequency ranges.

An object of the invention is to obviate these disadvantages for a circuit arrangement of the kind mentioned in the preamble, the circuit arrangement according to the invention being characterized in that the resonance circuit for a first frequency range is connected to a first electrode of an amplifier element on the one hand and through a coupling impedance to a second electrode of the amplifier element on the other hand, a shunt impedance also being operative between the first and the second electrodes of the amplifier element, and that the resonance circuit for the subsequent lower frequency range is connected between the second electrode of the amplifier element and a tap on the resonance circuit for the first frequency range, the tap being so positioned that a bridge circuit substantially being balanced in the first frequency range is formed by the coupling impedance and the shunt impedance on the one hand and between the parts of the resonance circuit of the said frequency range on the other hand, which parts are formed by the tapping.

In order that the invention may be readily carried into effect, it will now be described in detail, by way of example, with reference to the accompanying diagrammatic drawing.

In the figure the incoming oscillations from a terminal 1 are applied to the emitter of a transistor 2 of the type AF 239 the base of which is connected to the tap of a potentiometer which contains a resistor 3 of 2.2 KΩ connected to the positive terminal of a supply source and a resistor 4 of 5.6 KΩ connected to the grounded negative terminal of the supply source, the potentiometer also being connected to ground through a capacitor 5 of 1000 pf. Furthermore the emitter is connected to the positive terminal of the supply source through a choke inductance 6 and a resistor 7 of 1000Ω, the resistor 7 furthermore being shunted relative to ground by a capacitor 8 of 100 pf.

The collector of the transistor 2 is connected to an intermediate frequency output terminal 13 through an RF-choke 10, a subsequent shunt capacitor 11 of 3.9 pf. and a transforming inductance 12, the supply lead of said terminal being connected to ground through a lead-through capacitance 14 of 100 pf. A tap of the inductance 12 is also connected to ground thus establishing the DC-connection between collector and supply source.

A Lecher lead 15 which serves to tune in the UHF-range of approximately 470 to 800 mc./s. is connected to ground on the one hand and is connected on the other hand to the collector of the transistor 2 through a capacitor 16 of 2.7 pf. serving as a coupling impedance. Coupled to the lead 15 is a conductor 17 which is connected to ground at the end at which the adjacent end of the lead 15 is connected to the transistor 2. The other end of the conductor 17 which is adjacent to the grounded end of the lead 15 is connected to the emitter of transistor 2 through a capacitor 18 of 18 pf.; as a result the required feedback for generating the UHF-oscillations is brought about. Superposition of the input signal oscillations on the oscillator self oscillations in transistor 2 results in known manner in an intermediate frequency signal which can be derived from the terminal 13 after filtering off the radio-frequency oscillations. The oscillatory circuit with the lead 15 is tuned due to the anode of a voltage-dependent diode 19 of the type BA 141 being connected to its end which is not grounded, the cathode of said diode being connected to ground relative to the radio-frequency oscillations through a capacitor 20 of 1000 pf. and to which cathode the tuning voltage is applied through a resistor 21 of 22 KΩ. Said tuning voltage occurs at the slide contact of a potentiometer 22 which is arranged between ground and a stabilized positive voltage ++. The resistor 21 is connected to a contact 21*a* which can be switched over to various contacts in the television reception ranges I and III and in the UHF-range indicated by V; there is a connection of ground or to a point of negative potential in the ranges I and III so that the diode 19 then has a maximum capacitance and possibly passes current and has a damping effect.

For generating oscillator oscillations in the television bands I and III from approximately 40 to 60 mc./s. and from approximately 180 to 220 mc./s., respectively, further resonance circuits are switched on which, however, must be switched off in the UHF-range (IV/V). To this end a bridge circuit is formed. The collector base capacitance and furthermore the stray capacitances which are indicated by a capacitor 23 of approximately 3 pf. shown by a broken line are operative between the collector of the transistor 2 and the base connected to ground with respect to alternating current. By suitably proportioning the capacitor 16 relative to the capacitance 23 and by choosing the position of a tap 25 on the lead 15 being approximately at the center, a bridge circuit can thus be formed the neutral branch of which lies between the collector of the transistor 2 and the tap 25.

This neutral branch includes the resonance circuit for the subsequent lower frequency range III which circuit consists of an inductance 26 with which a tuning diode 27 in series with a capacitor 28 of 1000 pf. is connected in parallel. Said resonance circuit is connected on the one hand to the tap 25 and on the other hand through a second coupling impedance 29 to the collector of transistor 2. Furthermore the series arrangement of two capacitors 30 and 31 of 0.5 pf. each is connected between ground and the end of the inductance 26 connected to the capacitor 29 of 1 pf., the junction of said capacitors being connected to the emitter of transistor 2 through a choke inductance 32 of 0.1 $\mu$h.; as a result the required feedback for range III is obtained. The inductance 32 renders said feedback branch for the range V of the UHF-frequencies inoperative while said branch is also substantially switched off for the subsequent range I of lower frequencies since the capacitors 30 and 31 are comparatively small. The tuning is changed due to the cathode of the diode 27 connected to the capacitor 28 being connected through a resistor 33 of 22 kilohm to a converter 33*a* which establishes the connection to the slide contact of potentiometer 22 in the range III but otherwise connects the diode to ground or to a voltage which is more negative as has already been described for the diode 19. Since the lead 15 in this frequency range has substantially a negligible impedance the resonance circuit (26, 27) therefore is connected between ground and the collector of transistor 2.

Also this resonance circuit, which is particularly formed by the inductance 26 and the tuning diode 27, again forms a bridge circuit. One branch of said circuit comprises the capacitance operative between the collector and ground in this freqeuncy range which capacitance is formed on the one hand by the capacitor 23, together with the capacitance of the capacitor 16 in particular; in fact for the VHF-range III the said capacitor is substantially connected to ground through the lead 15 and possibly the diode 19. The inductance 26 has a tap 35 such that approximately one third of the inductance 26 occurs between said tap and the end connected to the tap 25 and which together with the capacitor 29 is chosen to be such that a neutral bridge branch is formed between the collector of transistor 2 and the tap 35 in this frequency range, which branch includes the resonance circuit for band I with the inductance 36.

A diode 37 in series with a capacitor 38 of 1000 pf. is connected parallel to the inductance 36; said oscillatory circuit is connected on the one hand to the tap 35 and on the other hand through a third coupling capacitor 39 of 1.5 pf. to the collector of transistor 2.

Furthermore the series arrangement of a capacitor 40 of 4 pf. and a capacitor 41 of 10 pf. grounded at the other end is connected to the junction of the inductance 36 and the capacitor 39, the junction of said capacitors being connected through an inductance 42 of approximately 2 $\mu$h. to the emitter of transistor 2. As a result a feedback is obtained which is in fact only operative in this frequency range in the manner as described for the resonance circuit 26, 27.

The cathode of the diode 37 connected to the capacitor 38 is coupled through a resistor 43 of 22 KΩ to a switch 43*a* which establishes a connection to the slide contact of tuning potentiometer 22 for the range I and establishes a connection to ground or to a negative potential in the other reception ranges, such as has been described for the diodes 19 and 27.

Upon reception in a frequency range, the switches connect those of the tuning diodes 19, 27 and 37 to a constant voltage value which do not belong to the said range so that these diodes assume fixed capacitance values which lie outside the normal range of variation determined by the tuning voltage of potentiometer 22. The cathodes of these diodes may preferably be connected to a negative voltage in such manner that they become conductive and cause a strong damping, so that no resonance occurs and the impedance of the connected resonance circuits becomes small. Such bridge circuits switched off by the diode-biases can also serve for amplifier stages which have no feedback.

Due to a resonance circuit for a frequency range forming, together a bridge circuit with the associated elements the neutral branch of which includes the resonance circuit for the subsequent lower frequency range, a considerable decoupling between the separate resonance circuits is achieved in spite of the fact that the resonance circuits are always connected together.

What is claimed is:

1. A multiple band variable tuning circuit for a circuit including an amplifier device, comprising an amplifier device having first and second electrodes, first and second resonant circuits, each of said resonant circuits including a separate voltage dependent reactance, means connecting one end of said first resonant circuit to said first electrode, means connecting one end of said second resonant circuit to a tap on said first resonant circuit, first and second coupling means for connecting said second electrode to the other ends of said first and second resonant circuits respectively, a source of variable voltage, and means for applying said voltage to said voltage dependent reactances, said amplifier device further including effective shunt reactance between said first and second electrodes, whereby said shunt reactance, first coupling means and first resonant circuit form a bridge circuit, said first resonant circuit being tunable over a first frequency range by means of said variable voltage that is higher than the range of said second resonant circuit, said tap being positioned so that said bridge circuit is balanced in said first frequency range.

2. A circuit as claimed in claim 1 further comprising frequency selective positive feedback means coupled between said second resonant circuit and said amplifier device, whereby said device oscillates within a selected band.

References Cited

UNITED STATES PATENTS

| | | | |
|---|---|---|---|
| 3,029,339 | 4/1962 | Pan | 325—468 |
| 3,204,207 | 8/1965 | Denker | 325—468X |
| 3,354,397 | 11/1967 | Wittig | 325—459 |
| 3,376,508 | 4/1968 | Jones | 325—459 |

ROBERT L. GRIFFIN, Primary Examiner

R. S. BELL, Assistant Examiner

U.S. Cl. X.R.

325—462; 334—14